(12) United States Patent
Avitan et al.

(10) Patent No.: US 8,933,741 B1
(45) Date of Patent: Jan. 13, 2015

(54) METHOD AND APPARATUS FOR GENERATING DELAY

(75) Inventors: Shimon Avitan, Kiryat Ata (IL); Reuven Ecker, Haifa (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 641 days.

(21) Appl. No.: 12/754,968

(22) Filed: Apr. 6, 2010

Related U.S. Application Data

(60) Provisional application No. 61/166,935, filed on Apr. 6, 2009, provisional application No. 61/184,946, filed on Jun. 8, 2009.

(51) Int. Cl.
*H03H 11/26* (2006.01)
*H03K 5/13* (2014.01)

(52) U.S. Cl.
CPC ..................................... *H03K 5/133* (2013.01)
USPC .......................................................... 327/261

(58) Field of Classification Search
None
See application file for complete search history.

(56) References Cited

U.S. PATENT DOCUMENTS

| | | | | |
|---|---|---|---|---|
| 5,559,473 A | * | 9/1996 | Anderson et al. | 331/34 |
| 6,924,683 B1 | * | 8/2005 | Hayter | 327/218 |
| 7,449,936 B2 | * | 11/2008 | Shin et al. | 327/378 |
| 2010/0134161 A1 | * | 6/2010 | Xu et al. | 327/157 |

* cited by examiner

*Primary Examiner* — Sibin Chen

(57) ABSTRACT

Aspects of the disclosure provide an integrated circuit having a delay element that is configured as a complementary voltage based current starved delay element. The delay element drives an output node to generate an output signal in response to an input signal received at an input node. The delay element includes a first switch transistor configured to switch on in response to the input signal satisfying a switching condition, and a second switch transistor configured to switch on in response to the input signal satisfying the switching condition. The first switch transistor drives the output node with a first current that is controlled by a first bias voltage. The second switch transistor drives the output node with a second current that is controlled by a second bias voltage. The first bias voltage and the second bias voltage are complementary. In an example, both the first switch transistor and the second switch transistor are NMOS transistors. In another example, both the first switch transistor and the second switch transistor are PMOS transistors.

20 Claims, 12 Drawing Sheets

METHOD AND APPARATUS FOR GENERATING DELAY

INCORPORATION BY REFERENCE

This application claims the benefit of U.S. Provisional Application No. 61/166,935, "Complementary Voltage Based Modified Current Starved Delay Element" filed on Apr. 6, 2009, and U.S. Provisional Application No. 61/184,946, "Complementary Voltage Based Modified Current Starved Delay Element" filed on Jun. 8, 2009, which are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Delay elements are used in various integrated circuits to control circuit timings. In an example, a delay locked loop (DLL) circuit includes a plurality of delay elements to form a delay line. The DLL circuit locks delays along the delay line, such as a delay between an output signal of the delay line and an input signal of the delay line, and the like. The delay locked input and output signal can be directed to other circuits to control operation timings of the other circuits.

SUMMARY

Aspects of the disclosure can provide an integrated circuit having a delay element that is configured as a complementary voltage based current starved delay element. The delay element drives an output node to generate an output signal in response to an input signal received at an input node. The delay element includes a first switch transistor configured to switch on in response to the input signal satisfying a switching condition, and a second switch transistor configured to switch on in response to the input signal satisfying the same switching condition. The first switch transistor drives the output node with a first current that is controlled by a first bias voltage. The second switch transistor drives the output node with a second current that is controlled by a second bias voltage. The first bias voltage and the second bias voltage are complementary. In an example, both the first switch transistor and the second switch transistor are n-type metal-oxide-semiconductor (NMOS) transistors. In another example, both the first switch transistor and the second switch transistor are p-type metal-oxide-semiconductor (PMOS) transistors. Further, the first switch transistor and the second switch transistor can have different width/length ratios. For example, the first switch transistor has a larger width/length ratio than the second switch transistor.

In an embodiment, the delay element further includes a first current switch transistor configured to provide the first current based on the first bias voltage, and a second current switch transistor configured to provide the second current based on the second bias voltage. Further, at least one of the first current switch transistor and the second current switch transistor has a configurable width/length ratio. In an example, the first current switch transistor and the second current switch transistor have different width/length ratios. One of the first current switch transistor and the second current switch transistor can be dominant that provides a dominant current for driving the output node. For example, the first current switch transistor has a larger width/length ratio than the second current switch transistor, and the first current switch transistor is dominant and provides a dominant current for driving the output node.

According to an aspect of the disclosure, the delay element is implemented in a complementary circuit. For example, the delay element includes a first complementary switch transistor configured to switch on in a complementary manner relative to the first switch transistor to drive the output node, and a second complementary switch transistor configured to switch on in a complementary manner relative to the second switch transistor to drive the output node.

According to another aspect of the disclosure, the delay element is implemented in a differential circuit. For example, the delay element includes a third switch transistor configured to form a differential pair with the first switch transistor, and a fourth switch transistor configured to form a differential pair with the second switch transistor. The third switch transistor and the fourth switch transistor drive a differential output node to generate a differential output signal in response to a differential input signal received at a differential input node.

Aspects of the disclosure can provide an integrated circuit (IC) having a delay locked loop (DLL). The DLL includes a plurality of delay elements coupled in series to form a delay line to delay a delay line output signal based on a control voltage in response to a delay line input signal. Each delay element drives a stage output node to generate a stage output signal in response to a stage input signal received at a stage input node. Further, the DLL includes a phase detector configured detect a delay between the delay line output signal and the delay line input signal, a control voltage generator configured to generate the control voltage for the delay line based on the detected delay. At least one of the delay elements is configured as a complementary voltage based current starved delay element.

Aspects of the disclosure can provide a method of generating a delay. The method includes generating a first current for driving a voltage on a capacitance load in a direction based on a first bias voltage, generating a second current for driving the voltage on the capacitance load in the direction based on a second bias voltage that is complementary to the first bias voltage, and driving the capacitance load by the first current and the second current in response to an input signal.

To generate the first current, the method includes controlling a first current switch transistor to generate the first current based on the first bias voltage. To generate the second current, the method includes controlling a second current switch transistor to generate the second current based on the second bias voltage. In an embodiment, the first current switch transistor and the second current switch transistor have different width/length ratios. For example, the first current switch transistor has a larger width/length ratio than the second current switch transistor. To drive the capacitance load, the method includes switching on a first switch transistor in response to the input signal satisfying a switching condition to direct the first current to the capacitance load, and switching on a second switch transistor in response to the input signal satisfying the switching condition to direct the second current to the capacitance load.

In an example, the method includes generating a first pull-down current for pulling down the voltage on the capacitance load based on the first bias voltage, generating a second pull-down current for pulling down the voltage on the capacitance load based on the second bias voltage, and pulling down the voltage on the capacitance load by a combination of the first pull-down current and the second pull-down current in response to the input signal.

In another example, the method includes generating a first pull-up current for pulling up the voltage on the capacitance load based on the second bias voltage, generating a second pull-up current for pulling up the voltage on the capacitance load based on the first bias voltage, and pulling up the voltage on the capacitance load by a combination of the first pull-up current and the second pull-up current.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
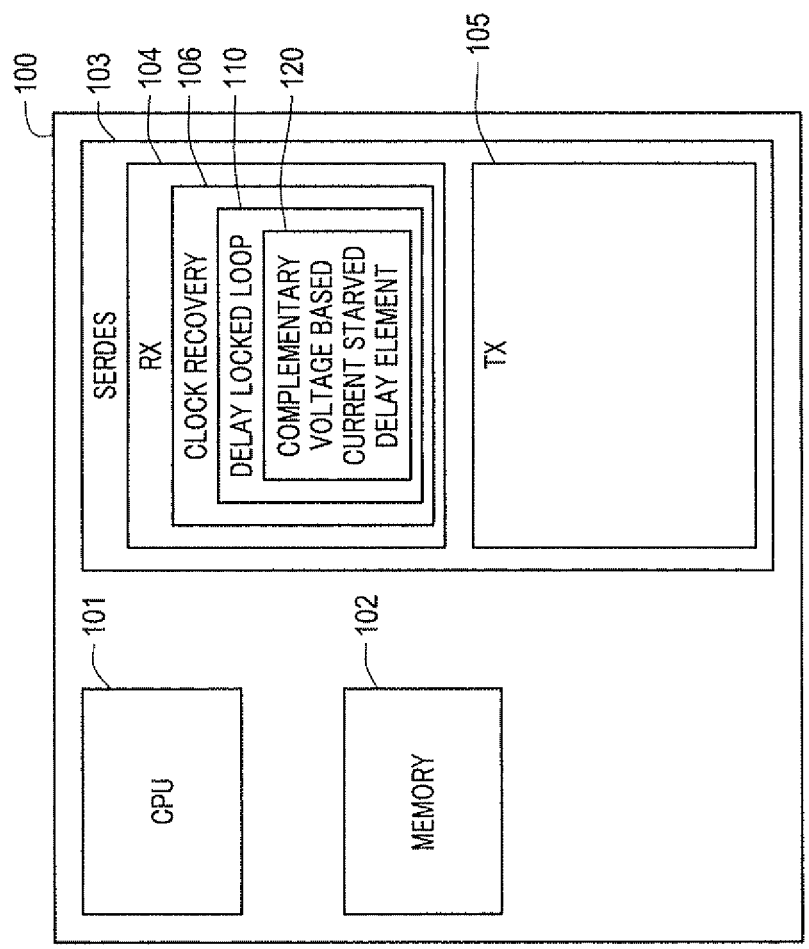
FIG. 1 shows a block diagram of an integrated circuit (IC) example 100 according to an embodiment of the disclosure.

FIG. 1 shows a block diagram of an integrated circuit (IC) example 100 according to an embodiment of the disclosure. The IC 100 includes a delay element 120 that is configured as a complementary voltage based current starved delay element. In an example, the IC 100 includes a serializer/deserializer (SERDES) module 103. The SERDES module 103 includes a receiver module 104 and a transmitter module 105. The receiver module 104 includes a clock recovery module 106 to recover a clock signal from a received data signal. The clock recovery module 106 includes a delay locked loop (DLL) 110. The DLL 110 includes a plurality of delay elements to form a delay line. At least one of the delay elements is configured as a complementary voltage based current starved delay element 120.

The delay element 120 includes a stage input node and a stage output node. The stage input node receives a stage input voltage, and the stage output node outputs a stage output voltage with a delay relative to the stage input voltage. Generally, the stage output node is coupled to a capacitance load, thus the delay at the stage output node depends on charging or discharging current for the capacitance load. According to an aspect of the disclosure, the charging or discharging current has a first portion controlled by a first bias voltage and a second portion controlled by a second bias voltage. The first bias voltage and the second bias voltage vary in opposite directions. In an example, the first bias voltage and the second bias voltage are a complementary pair such that a sum of the first bias voltage and the second bias voltage is substantially constant, such as being equivalent to a supply voltage VDD.

In an embodiment, the delay element 120 includes a first switch transistor and a second switch transistor to provide pull-up current (or pull-down current) to pull up (or pull down) the stage output node. The first switch transistor is coupled to a first current switch providing a first portion of the pull-up current (or pull-down current) that is controlled by the first bias voltage, and the second switch transistor is coupled to a second current switch providing a second portion of the pull-up current (or pull-down current) that is controlled by the second bias voltage. The first switch transistor and the second switch transistor are switched on in response to a same stage input voltage; thus the stage output voltage at the stage output node is pulled up (or pulled down) by the pull-up current (or pull-down current) including the first portion and the second portion. Thus, the delay between the stage output voltage and the stage input voltage is a function of the first bias voltage and the second bias voltage.

In an embodiment, the delay element 120 is configured to have an improved linearity and an improved noise immunity. In an example, when the first bias voltage increases, the first portion of the pull-up current (or pull-down current) increases according to a non-linear order that is higher than a linear order, for example. However, when the first bias voltage increases, the second bias voltage decreases, and results in the second portion of the pull-up current (or pull-down current) decreasing. Thus, when the first portion is dominant, the pull-up (or pull-down) current varies in a same direction as the first portion of the pull-up current, but with a lower order than the non-linear order. Thus, a delay gain ($\Delta T/\Delta V$) of the delay element 120 has an improved linearity.

Further, in an embodiment, because the second portion of the pull-up (or pull-down) current changes in the opposite direction of the first portion, the delay gain of the delay element 120 decreases. In an example, the decrease of the delay gain results in an improved noise immunity.

The delay element 120 can be implemented by various configurations, such as a complementary configuration that has pull-up switch transistors and pull-down switch transistors, a differential configuration that delays a pair of differential signals, and the like.

It is noted that the IC 100 can include other modules, such as a central processing unit (CPU) 101, a memory module 102, and the like.

Figure 2:
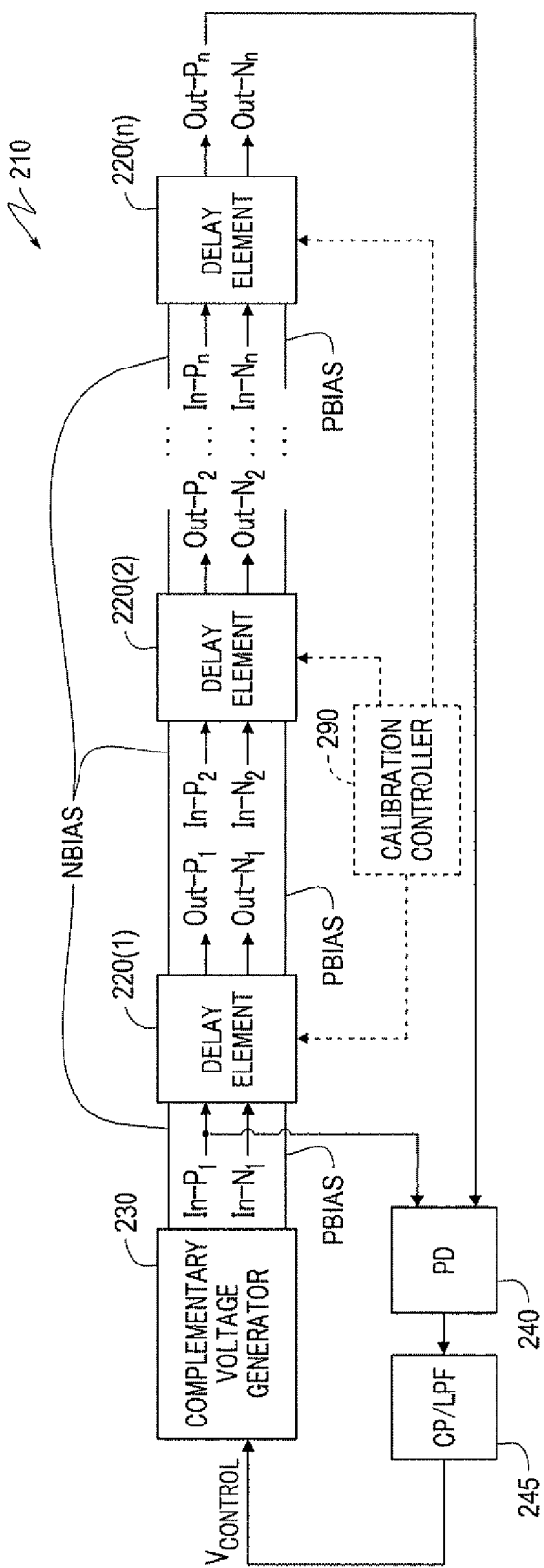
FIG. 2 shows a block diagram of a delay locked loop example 210 according to an embodiment of the disclosure.

FIG. 2 shows a block diagram of a delay locked loop (DLL) example 210 according to an embodiment of the disclosure. The DLL 210 includes a complementary voltage generator 230, a plurality of delay elements 220(1-n), a phase detector (PD) module 240, and a charge pump/low pass filter (CP/LPF) module 245. These elements are coupled together as shown in FIG. 2.

The complementary voltage generator 230 receives a control voltage, and generates a pair of complementary bias voltages NBIAS and PBIAS based on the received control voltage. The complementary bias voltages NBIAS and PBIAS change in opposite directions. Specifically, when NBIAS increases, PBIAS decreases; and when NBIAS decreases, PBIAS increases. In an embodiment, NBIAS is equivalent to the received control voltage, and PBIAS is equivalent to supply voltage VDD minus NBIAS. Thus, when the control voltage changes ΔV, NBIAS changes ΔV, and PBIAS changes ΔV.

The plurality of delay elements 220(1-$n$) are coupled in series to form a delay line. In addition, the plurality of delay elements 220(1-$n$) are implemented in a differential configuration. Specifically, each delay element 220($x$) ($x \in [1, n]$) includes a pair of stage input nodes to receive a pair of differential stage input signals (In-Px and In-Nx) from a previous delay element 220($x$-1), and includes a pair of stage output nodes to provide a pair of differential stage output signals (Out-Px and Out-Nx) to a next delay element 220($x$+1). Generally, the next delay element 220($x$+1) provides a capacitance load at the stage output nodes of delay element 220($x$), thus the delay between the stage output signals and the input signals depends on pull-up current or pull-down current of the delay element 220($x$).

In the FIG. 2 example, each delay element 220($x$) receives the complementary bias voltages NBIAS and PBIAS. The pull-down current (or pull-up current) includes a first portion and a second portion that are respectively controlled by the complementary bias voltages NBIAS and PBIAS. In an example, the pull-down current includes a first portion that is controlled by NBIAS, and a second portion that is controlled by PBIAS. When NBIAS increases, the first portion increases, and when NBIAS decreases, the first portion decreases. However, the first portion does not vary linearly to NBIAS. In an example, the first portion varies with NBIAS according to a non-linear order that is higher than the linear order. Similarly, the second portion varies with PBIAS. In an embodiment, each delay element 220 is suitably configured such that the first portion is a dominant portion when the control voltage range stays in a certain range. When the first portion is the dominant portion, a current change (absolute value) in the first portion is larger than a current change (absolute value) in the second portion.

The PD module 240 compares a delay line input signal and a delay line output signal, such as In-P1 and Out-Pn in FIG. 2, and generates a delay signal (a phase difference signal) that is indicative of the delay between the delay line input signal and the delay line output signal.

The CP/LPF module 245 receives the delay signal, pumps a charge pump based on the delay signal, filters out high frequency components, and generates the control voltage.

During operation, the DLL 210 locks the delay of the delay line (the delay between the delay line input signal and the delay line output signal) to a target delay value. For example, when the delay of the delay line is larger than the target delay value, the PD module 240 generates the delay signal indicative of the larger delay. Further, the CP/LPF module 245 receives the delay signal, pumps up the charge pump, filters out the high frequency components, and increases the control voltage. Then, the complementary voltage generator 230 increases NBIAS, and decreases PBIAS. Accordingly, the delay elements 220(1-$n$) increase the first portion of the pull-down current (and/or pull-up current), and decrease the second portion of the pull-down current (and/or pull-up current). Because the first portion is dominant, the pull-down current (and/or pull-up current) increases. Thus, the delay of the delay line decreases.

On the other hand, when the delay of the delay line is smaller than the target delay value, the PD module 240 generates the delay signal indicative of the smaller delay. Further, the CP/LPF module 245 receives the delay signal, pumps down the charge pump based on the delay signal, filters out the high frequency components, and decreases the control voltage. Then, the complementary voltage generator 230 decreases NBIAS, and increases PBIAS. Accordingly, the delay elements 220(1-$n$) decrease the first portion of the pull-down current (and/or pull-up current), and increase the second portion of the pull-down current (and/or pull-up current). Because the first portion is dominant, the pull-up current and/or the pull-down current decreases. Thus, the delay of the delay line increases.

In an embodiment, the DLL 210 includes configurable components, and is coupled to a calibration controller 290. The calibration controller 290 configures the configurable components during a calibration process to control the DLL 210 performance. In an example, it is preferred for the control voltage to stay in a certain range to have an improved performance, such as noise immunity. Each delay element 220 includes a current switch that is configurable. The current switch can be configured to provide different pull-down current, for example, to change the delay of the delay element 220. During a calibration process, the calibration controller 290 configures the configurable current switch in each delay element 220 to adjust a stage delay, such that the control voltage stays in the preferred range, and the delay of the delay line meets the target delay value.

Figure 3:
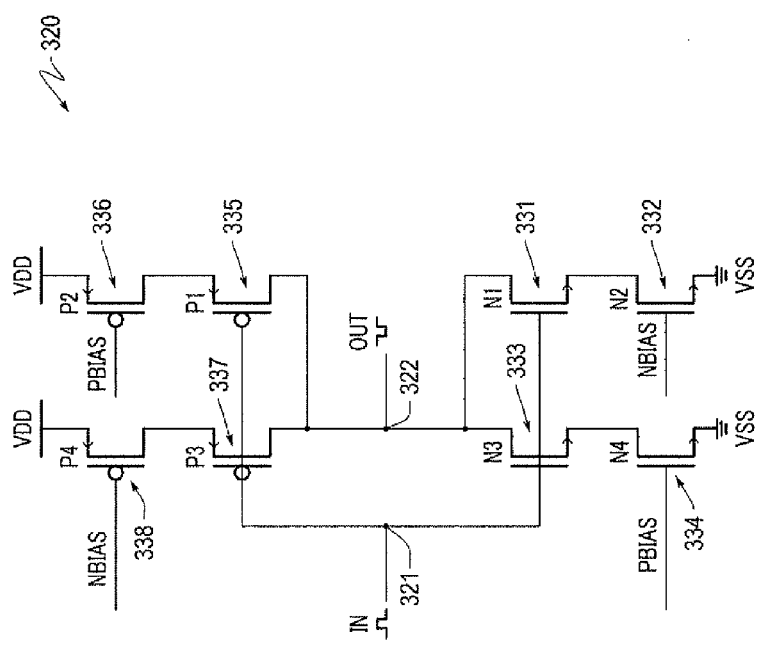
FIG. 3 shows a schematic diagram of a delay element example 320 according to an embodiment of the disclosure.

FIG. 3 shows a schematic diagram of delay element example 320 according to an embodiment of the disclosure. The delay element 320 is configured as a single-ended complementary voltage based current starved delay element. The delay element 320 includes an input node 321 to receive an input signal IN, and an output node 322 to output an output signal OUT. The delay element 320 includes two pull-up switch transistors 335 and 337, and two pull-down switch transistors 331 and 333 coupled between the input node 321 and the output node 322. Further, the delay element 320 includes two current switch transistors 336 and 338 to provide pull-up current, and two current switch transistors 332 and 334 to provide pull-down current. These elements are coupled as shown in FIG. 3.

In an embodiment, the two pull-down switch transistors 331 and 333 are configured as n-type metal-oxide-semiconductor (NMOS) transistors N1 and N3, and the two pull-down current switch transistors 332 and 334 are configured as NMOS transistors N2 and N4. N2 provides a first portion of the pull-down current to N1, and N4 provides a second portion of the pull-down current to N3. The first portion of the pull-down current is controlled by NBIAS, and the second portion of the pull-down current is controlled by PBIAS. In an embodiment, the two pull-down switch transistors N1 and N3 are sized differently, the two pull-down current switch transistors N2 and N4 are also sized differently. In an example, N1 has a larger width/length (W/L) ratio than N3, and N2 has a larger W/L ratio than N4. Thus, the first portion of the pull-down current is dominant.

In an embodiment, the two pull-up switch transistors 335 and 337 are p-type metal-oxide-semiconductor (PMOS) transistors P1 and P3, and the two pull-up current switch transistors 336 and 338 are PMOS transistors P2 and P4. P2 provides a first portion of the pull-up current to P1, and P4 provides a second portion of the pull-up current to P3. The first portion of the pull-up current is controlled by PBIAS, and the second portion of the pull-down current is control by NBIAS. In an embodiment, the two pull-up switch transistors P1 and P3 are sized differently, the two pull-up current switch transistors P2 and P4 are also sized differently. In an example, P1 has a larger width/length (W/L) ratio than P3, and P2 has a larger W/L ratio than P4. Thus, the first portion of the pull-up current is dominant.

During operation, in an example, NBIAS and PBIAS are generated based on a control voltage. For example, NBIAS is generated to be equivalent to the control voltage, and PBIAS is generated to be equivalent to VDD minus the control voltage. When the control voltage is relatively high, such as about VDD, NBIAS is relatively high, and PBIAS is relatively low. P2 is active to provide the pull-up current, and N2 is active to provide the pull-down current. However, P4 and N4 are deactivated. Further, P3 and N3 are deactivated.

When the control voltage is relatively low, such as about zero, NBIAS is relatively low, and PBIAS is relatively high. P4 is active to provide the pull-up current, and N4 is active to provide the pull-down current. However, P2 and N2 are deactivated. Further, P1 and N1 are deactivated.

When the control voltage is a medium value, such as about half VDD, and the like, both P2 and P4 are active to provide the pull-up current, and both N2 and N4 are active to provide the pull-down current. When the control voltage varies, for example by $\Delta V$, NBIAS varies by $\Delta V$ and PBIAS varies by $-\Delta V$. Thus, P2 varies the first portion of the pull-up current, for example, by $\Delta I_{up2}$, and P4 varies the second portion of the pull-up current in an opposite direction to the first portion of the pull-up current, for example, by $-\Delta I_{up4}$. N2 varies the first portion of the pull-down current, for example, by $\Delta I_{down2}$, and N4 varies the second portion of the pull-down current in an opposite direction to the first portion of the pull-down current, for example, by $-\Delta I_{down4}$. In an embodiment, P2 has a larger W/L ratio than P4, and thus the first portion of the pull-up current is dominant. N2 has a larger W/L ratio than N4, and thus the first portion of the pull-down current is dominant. Therefore, the change of the pull-up current $\Delta I_{up2}$-$\Delta I_{up4}$ is reduced comparing to $\Delta I_{up2}$, and the change of the pull-down current $\Delta I_{down2}$-$\Delta I_{down4}$ is reduced comparing to $\Delta I_{down2}$. Because the changes of the pull-up current and the pull-down current in response to the control voltage change are reduced, the change in delay $\Delta T$ is reduced. Thus, the delay gain of the delay element 320 ($\Delta T/\Delta V$) is reduced.

Figure 4:
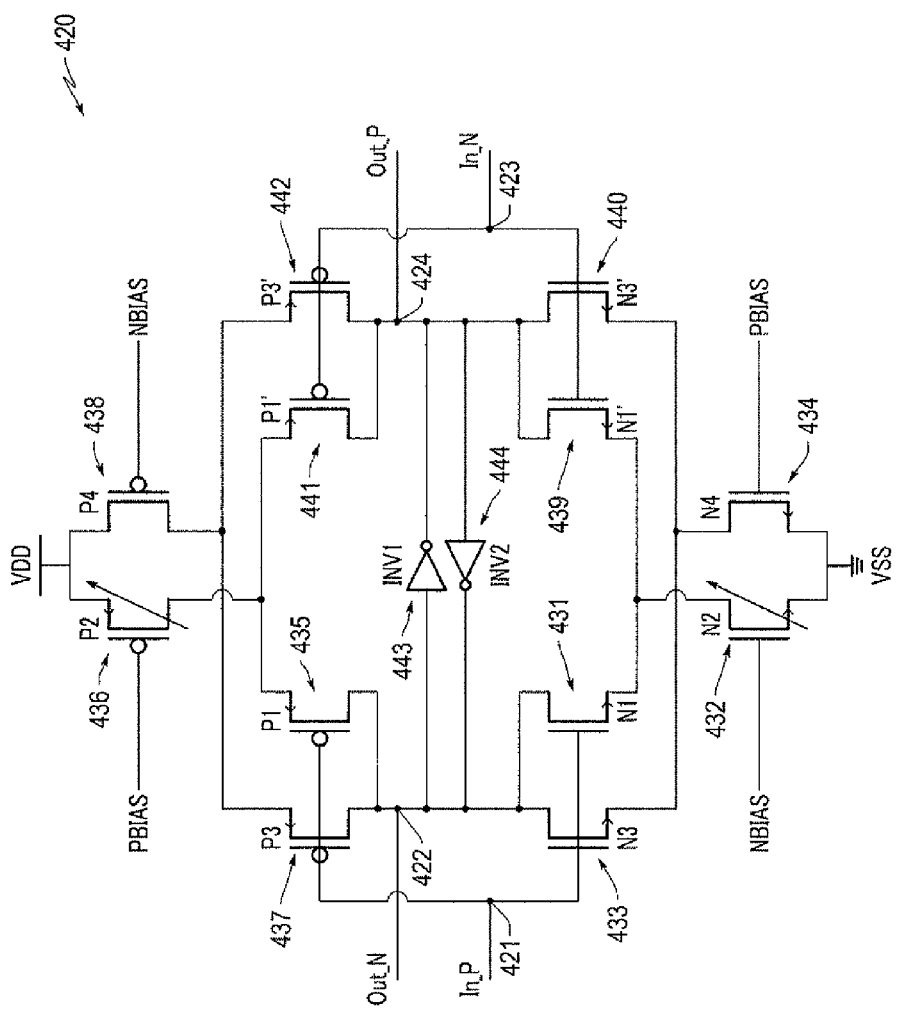
FIG. 4 shows a schematic diagram of another delay element example 420 according to an embodiment of the disclosure.

FIG. 4 shows a schematic diagram of delay element example 420 according to an embodiment of the disclosure. The delay element 420 is configured as a differential complementary voltage based current starved delay element. The delay element 420 includes a pair of differential input nodes (421 and 423) to receive a pair of differential input signals In_P and In_N, and a pair of differential output nodes (422 and 424) to output a pair of differential output signals Out_P and Out_N. The delay element 420 includes four pull-up switch transistors 435, 441, 437 and 442, and four pull-down switch transistors 431, 439, 433 and 440 coupled between the input nodes and the output nodes. Further, the delay element 420 includes two current switch transistors 436 and 438 to provide pull-up current, and two current switch transistors 432 and 434 to provide pull-down current. Further, the delay element 420 includes two inverters 443 and 444 to cross-couple the pair of differential output nodes. These elements are coupled together as shown in FIG. 4.

In an embodiment, the four pull-down switch transistors 431, 439, 433 and 440 are NMOS transistors N1, N1', N3, and N3', and the two pull-down current switch transistors 432 and 434 are NMOS transistors N2 and N4. N1 and N1' are a differential pair that employs a first portion of the pull-down current provided by N2. N3 and N3' are also a differential pair that employs a second portion of the pull-down current provided by N4. In an example, N1 and N1' are placed close to each other in a layout. Further, N1 and N1' are configured based on a same library cell, and have substantially same sizes. Similarly, N3 and N3' are placed close to each other. N3 and N3' are configured based on a same library cell, and have substantially same sizes. Further, N1 and N1' are sized differently from N3 and N3'. In an example, N1 and N1' have a larger W/L ratio than N3 and N3'.

In the FIG. 4 example, the first portion of the pull-down current is controlled by NBIAS, and the second portion of the pull down current controlled by PBIAS. NBIAS and PBIAS vary in opposite directions to control the pull-down current. In an example, NBIAS and PBIAS are a pair of complementary voltages such that a sum of NBIAS and PBIAS is substantially constant, such as equivalent to VDD, and the like. In an embodiment, the two current switch transistors N2 and N4 are sized differently. For example, N2 has a larger W/L ratio than N4. Thus, the first portion of the pull-down current is dominant. Further, N2 has a configurable size. The size of N2 can be configured during a calibration process to improve noise immunity, for example.

In an embodiment, the four pull-up switch transistors 435, 441, 437 and 442 are PMOS transistors P1, P1', P3, and P3', and the two pull-up current switch transistors 436 and 438 are also PMOS transistors P2 and P4. P1, P2, P3, P4, P1' and P3' are coupled to N1, N2, N3, N4, N1' and N3' in a complementary manner. P1 and P1' are a differential pair that employs a first portion of the pull-up current provided by P2. P3 and P3' are also a differential pair that employs a second portion of the pull-up current provided by P4. In an example, P1 and P1' are placed close to each other in a layout. Further, P1 and P1' are configured based on a same library cell, and have substantially same sizes. Similarly, P3 and P3' are placed close to each other. P3 and P3' are configured based on a same library cell, and have substantially same sizes. Further, P1 and P1' are sized differently from P3 and P3'. In an example, P1 and P1' have a larger width/length ratio than P3 and P3'.

In the FIG. 4 example, the first portion of the pull-up current is controlled by PBIAS, and the second portion of the pull-up current is controlled by NBIAS. NBIAS and PBIAS vary in opposite directions to control the pull-up current. As described earlier, in an example, NBIAS and PBIAS are a pair of complementary voltages such that a sum of NBIAS and PBIAS is substantially constant, such as equivalent to VDD, and the like. In an embodiment, the two current switch transistors P2 and P4 are sized differently. For example, P2 has a larger W/L ratio than P4. Thus, the first portion of the pull-up current is dominant. Further, P2 has a configurable size. The size of P2 can be configured during a calibration process to improve noise immunity, for example.

During operation, in an example, NBIAS and PBIAS are generated based on a control voltage. For example, NBIAS is generated to be equivalent to the control voltage, and PBIAS is generated to be equivalent to VDD minus the control voltage. When the control voltage is relatively high, such as about VDD, NBIAS is relatively high, and PBIAS is relatively low. P2 is active to provide the pull-up current, and N2 is active to provide the pull-down current. However, P4 and N4 are deactivated. Further, P3, P3', N3 and N3' are deactivated.

When the control voltage is relatively low, such as about zero, NBIAS is relatively low, and PBIAS is relatively high. P4 is active to provide the pull-up current, and N4 is active to provide the pull-down current. However, P2 and N2 are deactivated. Further, P1, P1', N1 and N1' are deactivated.

When the control voltage is a medium value, such as about half VDD, and the like, both P2 and P4 are active to provide the pull-up current, and both N2 and N4 are active to provide the pull-down current. When the control voltage varies, for example by $\Delta V$, NBIAS varies by $\Delta V$ and PBIAS varies by $-\Delta V$. Thus, P2 varies the first portion of the pull-up current, for example, by $\Delta I_{up2}$, P4 varies the second portion of the pull-up current in an opposite direction to the first portion of the pull-up current, for example, by $-\Delta I_{up4}$, N2 varies the first portion of the pull-down current, for example, by $\Delta I_{down2}$, and N4 varies the second portion of the pull-down current in an opposite direction to the first portion of the pull-down current, for example, by $-\Delta I_{down4}$. In an embodiment, P2 has a larger W/L ratio than P4, and thus the first portion of the pull-up current is dominant. N2 has a larger W/L ratio than N4, and thus the first portion of the pull-down current is dominant. Thus, the change of the pull-up current $\Delta I_{up2}$-$\Delta I_{up4}$ is reduced comparing to $\Delta I_{up2}$, and the change of the pull-down current $\Delta I_{down2}$-$\Delta I_{down4}$ is reduced comparing to $\Delta I_{down2}$. Further, the reduced changes in the pull-up current and the pull-down current result in a reduced change of the delay $\Delta T$. The delay gain of the delay element 420 ($\Delta T/\Delta V$) is reduced.

Figure 5:
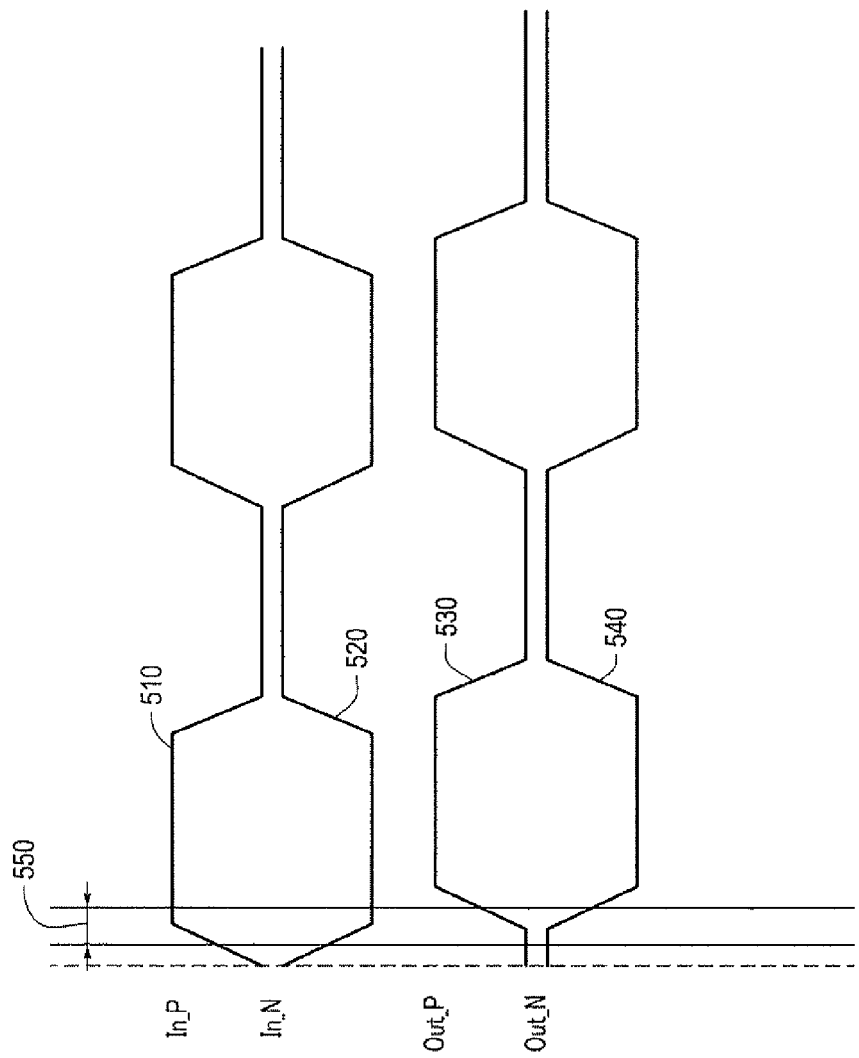
FIG. 5 shows a timing diagram example for the delay element 420 according to an embodiment of the disclosure.

FIG. 5 shows a timing diagram example for the delay element 420 according to an embodiment of the disclosure. The timing diagram includes curve 510 for the positive input signal In_P, curve 520 for the negative input signal In_N, curve 530 for the positive output signal Out_P, and curve 540 for the negative output Out_N. The differential output signals Out_P and Out_N have a delay 550 to the differential input signals In_P and In_N.

Figure 6:
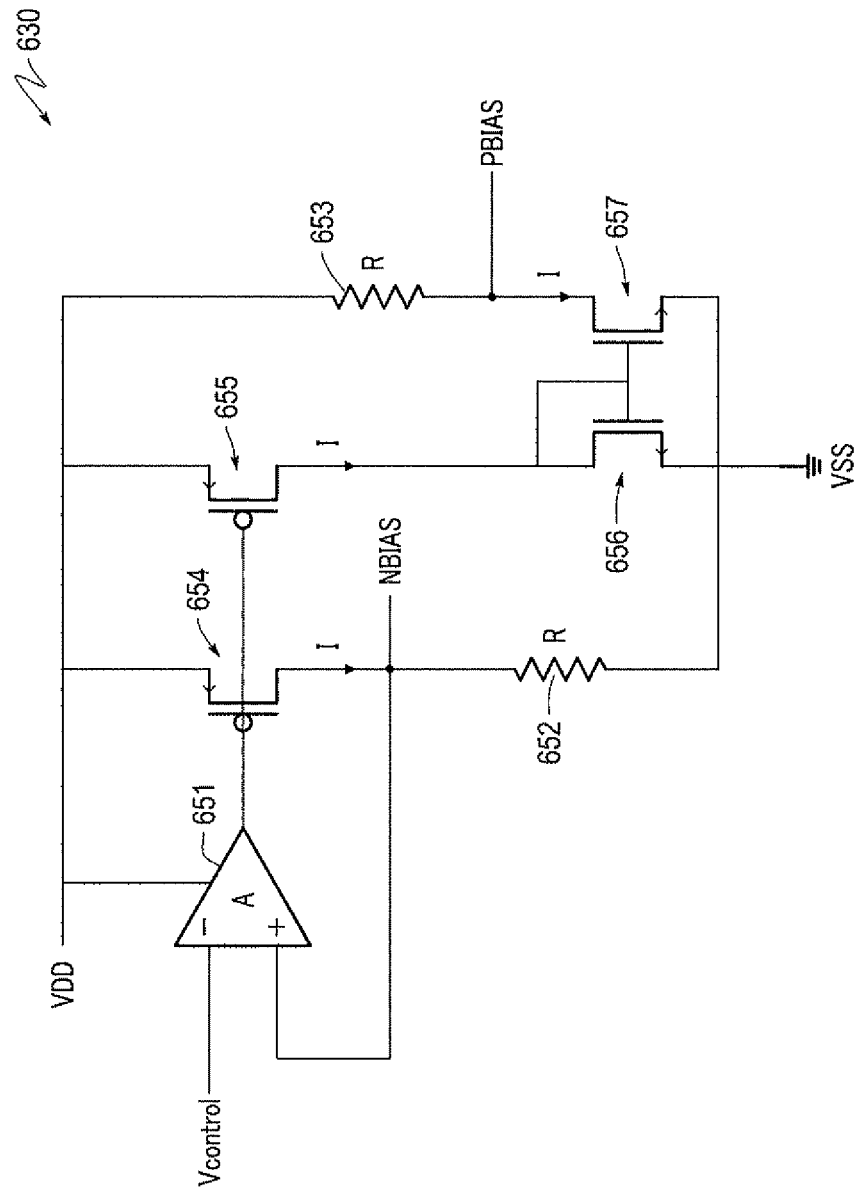
FIG. 6 shows a schematic diagram of a complementary voltage generator example 630 according to an embodiment of the disclosure.

FIG. 6 shows a schematic diagram of a complementary voltage generator example 630 according to an embodiment of the disclosure. The complementary voltage generator 630 includes an operational amplifier 651, a first resistor 652, a second resistor 653, a first PMOS transistor 654, a second PMOS transistor 655, a first NMOS transistor 656, and a second NMOS transistor 657. These elements are coupled together as shown in FIG. 6.

The complementary voltage generator 630 operates based on a first supply voltage supply VDD, and a second voltage supply VSS that is ground. Further, the complementary voltage generator 630 receives a control voltage (Vcontrol), and generates a first bias voltage NBIAS, and a second bias voltage PBIAS. The first PMOS transistor 654, the second PMOS transistor 655, the first NMOS transistor 656, the second NMOS transistor 657, the first resistor 652 and the second resistor 653 are suitably configured, such that the first bias voltage NBIAS and the second bias voltage PBIAS are a pair of complementary voltages. For example, a sum of the first bias voltage NBIAS and the second bias voltage PBIAS is equivalent to VDD that is substantially constant.

In an example, the first PMOS transistor 654 and the second PMOS transistor 655 are of the same size and form a current mirror, and thus the first PMOS transistor 654 and the second PMOS transistor 655 pass a same amount of current, shown as current I in FIG. 6. The first NMOS transistor 656 and the second PMOS transistor 655 are on a same current path, and thus the first NMOS transistor 656 also passes current I. Similarly, the first NMOS transistor 656 and the second NMOS transistor 657 are of the same size and form a current mirror, thus the first NMOS transistor 656 and the second NMOS transistor 657 pass the same amount of current, which is current I. Therefore, the first resistor 652 and the second resistor 653 pass the same amount of current I. The first resistor 652 and the second resistor 653 are of a same resistance R, thus voltage drops on the first resistor 652 and the second resistor 653 are the same. Voltage drop on the first resistor 652 is the first bias voltage NBIAS, thus voltage drop on the second resistor 653 is equivalent to the first bias voltage NBIAS. Therefore, the second bias voltage PBIAS is equivalent to VDD minus the first bias voltage NBIAS, and thus NBIAS and PBIAS are complementary.

In the FIG. 6 example, the first bias voltage NBIAS is equivalent to the control voltage Vcontrol, and the second bias voltage PBIAS is equivalent to VDD minus the control voltage Vcontrol.

Figure 7:
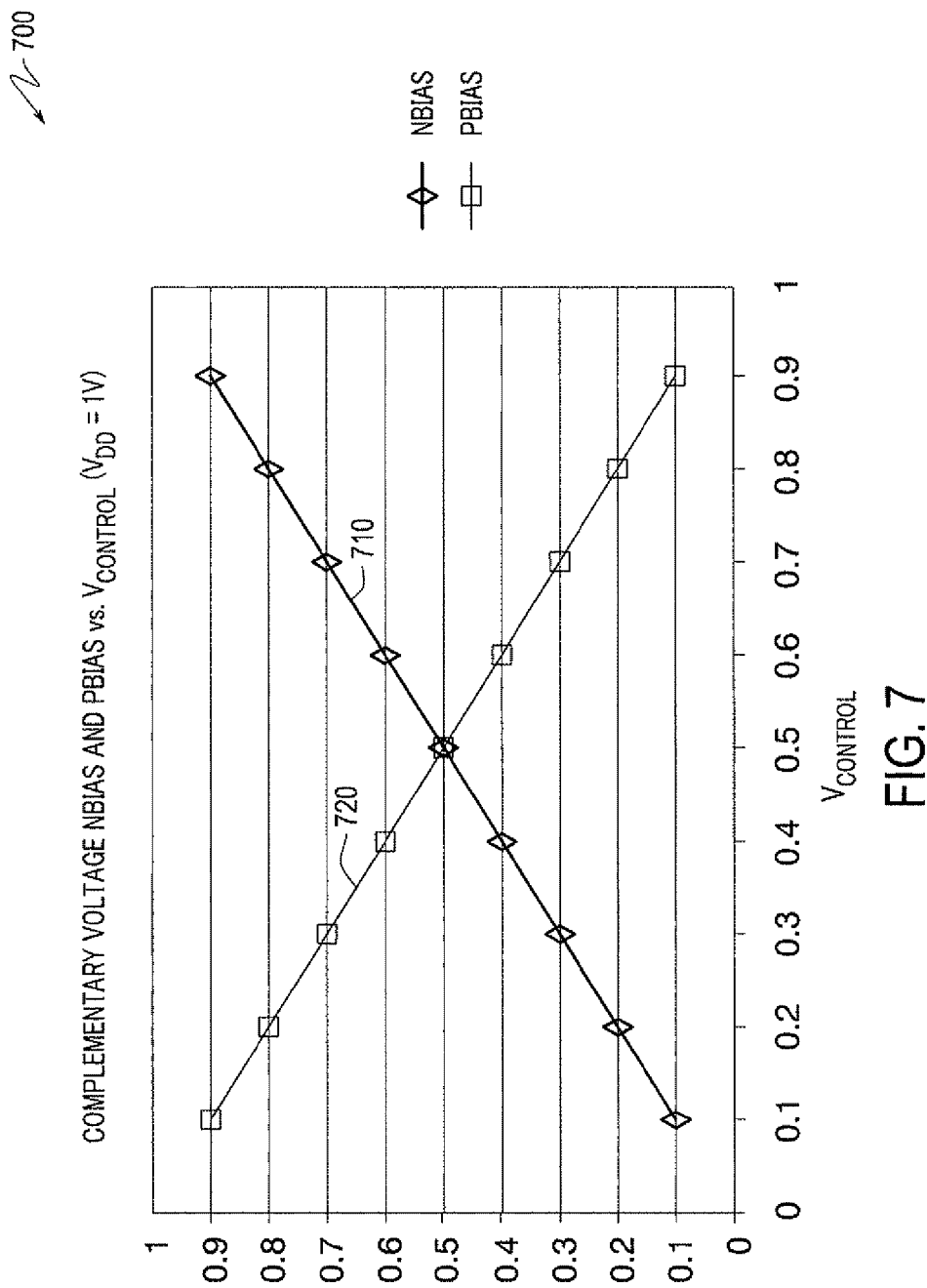
FIG. 7 shows a plot 700 of complementary voltages example according to an embodiment of the disclosure.

FIG. 7 shows a plot 700 of complementary voltages example according to an embodiment of the disclosure. The plot 700 includes a first curve 710 for NBIAS and a second curve 720 for PBIAS. NBIAS and PBIAS are a pair of complementary voltages. In the FIG. 7 example, the supply voltage VDD is equivalent to 1V, and the control voltage (Vcontrol) varies in a range of [0.1V, 0.9V]. The first curve 710 shows that NBIAS is equivalent to the control voltage, and the second curve 720 shows that PBIAS is equivalent to VDD minus NBIAS.

Figure 8:
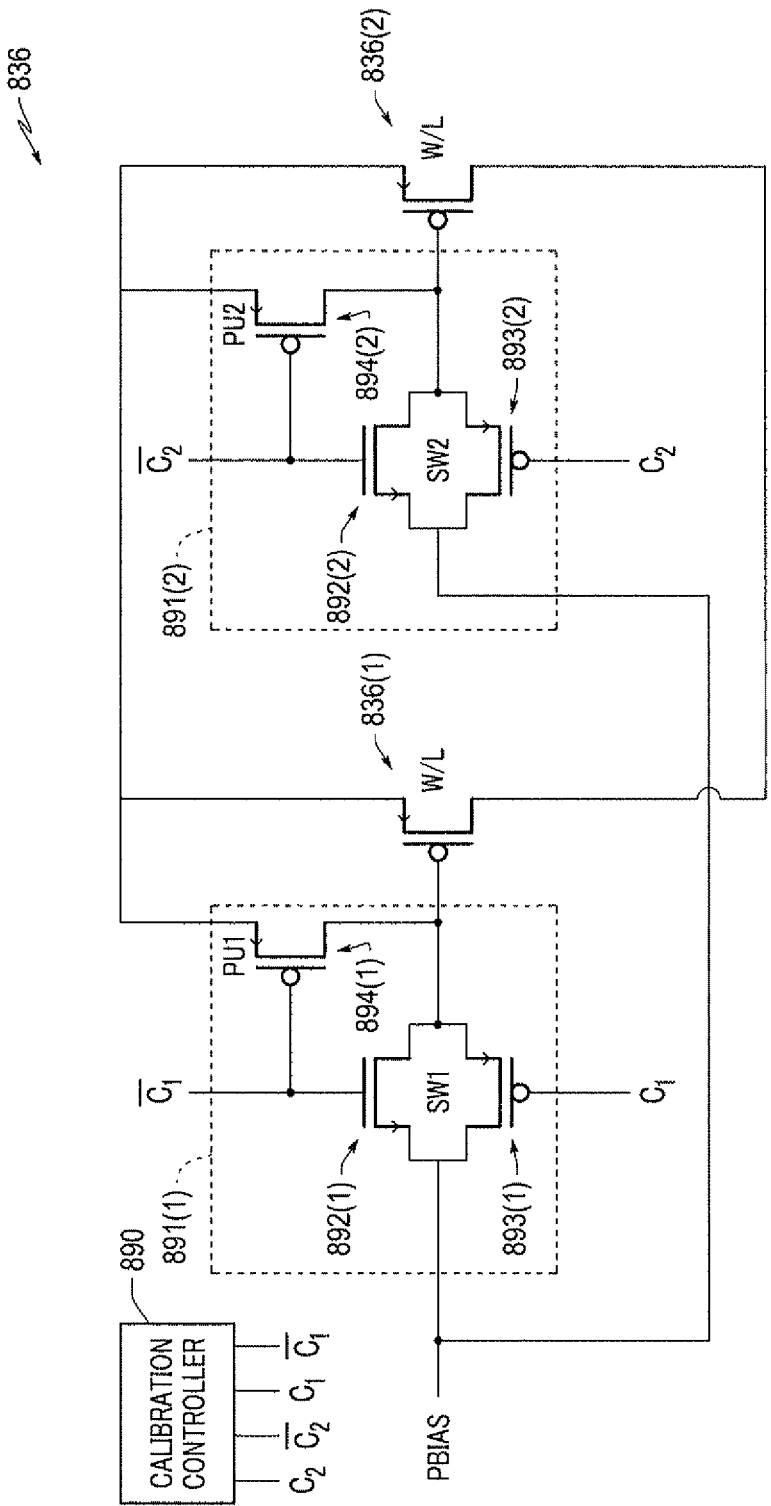
FIG. 8 shows a schematic diagram of a configurable transistor example 836 according to an embodiment of the disclosure.

FIG. 8 shows a schematic diagram of an implementation of a p-type current switch transistor module example 836 according to an embodiment of the disclosure. The current switch transistor module 836 includes a plurality of switchable transistors, such as a first transistor 836(1) and a second transistor 836(2) in FIG. 8. The first transistor 836(1) is coupled to a bias voltage, such as PBIAS, via a first pass switch 891(1), and the second transistor 836(2) is coupled to the bias voltage PBIAS via a second pass switch 891(2).

The first pass switch 891(1) includes a pair of pass transistors 892(1) and 893(1), and a disable transistor 894(1). Similarly, the second pass switch 891(2) includes a pair of pass transistors 892(2) and 893(2), and a disable transistor 894(2).

The first pass switch 891(1) and the second pass switch 891(2) are controlled by a calibration controller 890. The calibration controller 890 provides calibration bits, such as C1, $\overline{C1}$, C2, and $\overline{C2}$, and the like, to configure the current switch transistor module 836 to provide different current. For example, when C1 is "1", and $\overline{C1}$ is "0", the pass transistors 892(1) and 893(1) are switched off, and the disable transistor 894(1) turns on to pull-up the gate voltage of the first transistor 836(1) to deactivate the first transistor 836(1). When C1 is "0", and $\overline{C1}$ is "1", the pass transistors 892(1) and 893(1) are switched on to direct the bias voltage PBIAS to the gate of the first transistor 836(1), and the disable transistor 894(1) turns off to decouple the gate of the first transistor 836(1) from VDD. Thus, the first transistor 836(1) provides a current based on the bias voltage PBIAS.

Similar techniques with suitable changes can be used to implement n-type current switch transistor module.

Figure 9:
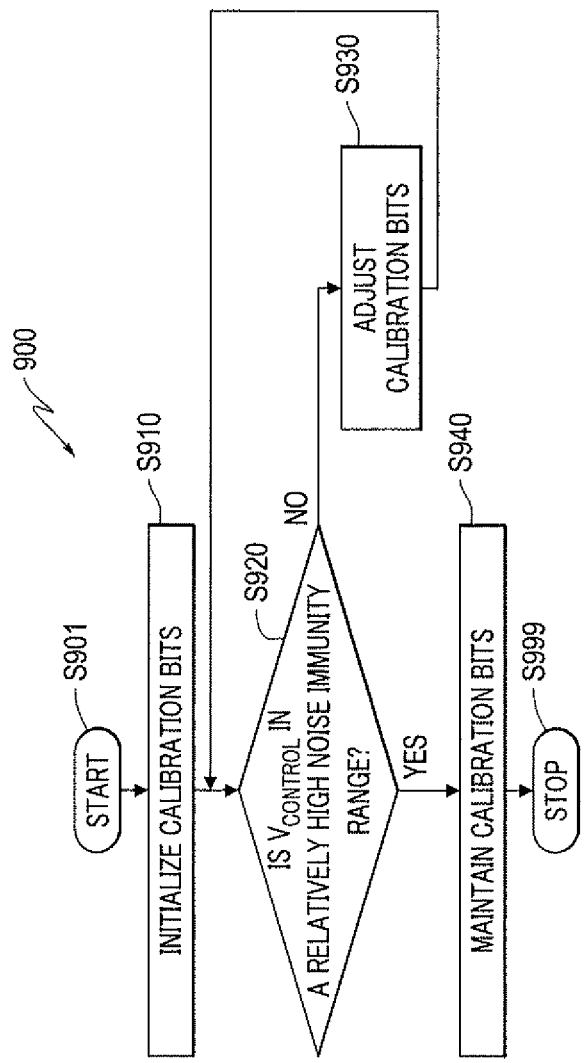
FIG. 9 shows a flow chart outlining a calibration process according to an embodiment of the disclosure.

FIG. 9 shows a flow chart outlining a calibration process example 900 performed by a calibration controller according to an embodiment of the disclosure. The process starts at S901 and proceeds to S910.

At S910, the calibration controller initializes calibration bits. The calibration bits are provided to corresponding current switch transistor modules to configure the current provided by the current switch transistor modules.

At S920, the calibration controller determines whether the control voltage is in a preferred range, such as a relatively high noise immunity range. When the control voltage is in the preferred range, the process proceeds to S940; otherwise the process proceeds to S930.

At S930, the calibration controller adjusts the calibration bits to increase or decrease the current provided by the current switch transistor modules.

At S940, the calibration controller maintains the calibration bits. For example, the calibration controller stores the calibration bits in a memory of the IC 100. The current switch transistor modules are configured based on the stored calibration bits. The process proceeds to S999 and terminates.

In an example, the calibration controller is on the IC 100, and can suitably repeat the process 900, for example, when a temperature change is detected. In another example, the calibration controller is external to the IC 100, and is coupled to the IC 100 at a calibration time.

Figure 10:
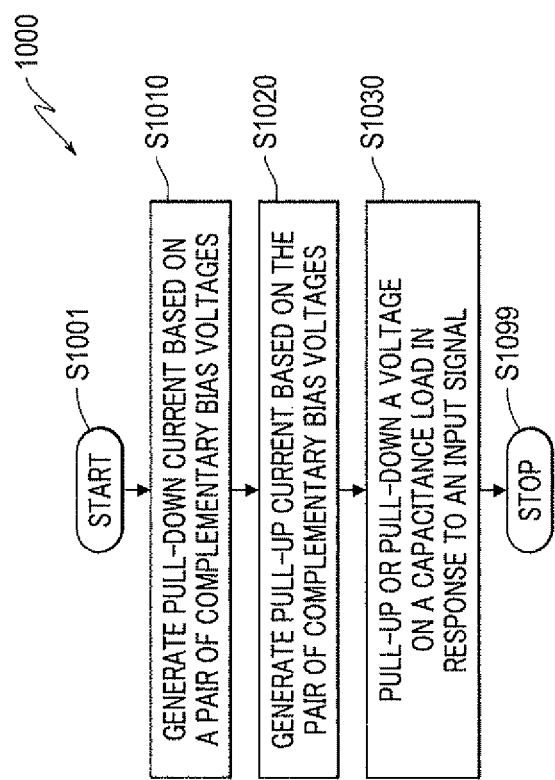
FIG. 10 shows a flow chart outlining a process for generating a delay according to an embodiment of the disclosure.

FIG. 10 shows a flow chart outlining a process 1000 for a delay element to generate an output signal in response to an input signal with a delay controlled by a control voltage according to an embodiment of the disclosure. The process starts at S1001 and proceeds to S1010.

At S1010, the delay element generates pull-down current based on a pair of complementary bias voltages NBIAS and PBIAS. In an example, NBIAS and PBIAS are generated based on the control voltage. For example, NBIAS is equivalent to the control voltage, and PBIAS is equivalent to a supply voltage VDD minus the control voltage. In an embodiment, the delay element includes a first pull-down current switch transistor to generate a first portion of the pull-down current based on NBIAS, and a second pull-down current switch transistor to generate a second portion of the pull-down current based on PBIAS.

At S1020, the delay element generates pull-up current based on the pair of complementary bias voltages NBIAS and PBIAS. In an embodiment, the delay element includes a first pull-up current switch transistor to generate a first portion of the pull-up current based on PBIAS, and a second pull-up current switch transistor to generate a second portion of the pull-up current based on NBIAS.

At S1030, the delay element pulls up or pulls down a voltage on a capacitance load in response to the input signal to generate the output signal. In an example, the delay element includes a first pull-up switch transistor, a second pull-up switch transistor, a first pull-down switch transistor, and a second pull-down switch transistor. The first pull-up switch transistor and the second pull-up switch transistor switch on in response to the input signal satisfying a condition, such as being relatively low, and the like. When the first pull-up switch transistor switches on, the first portion of the pull-up current is directed to the capacitance load to pull up the voltage. When the second pull-up switch transistor switches on, the second portion of the pull-up current is directed to the capacitance load to pull up the voltage.

The first pull-down switch transistor and the second pull-down switch transistor switch in a complementary manner relative to the first pull-up switch transistor and the second pull-up switch transistor. For example, when the input signal is relatively low, the first pull-up switch transistor and the second pull-up switch transistor switch on; and the first pull-down switch transistor and the second pull-down switch transistor switch off. When the input signal is relatively high, the first pull-up switch transistor and the second pull-up switch transistor switch off; and the first pull-down switch transistor and the second pull-down switch transistor switch on. When the first pull-down switch transistor switches on, the first portion of the pull-down current is directed to the capacitance load to pull down the voltage. When the second pull-down switch transistor switches on, the second portion of the pull-down current is directed to the capacitance load to pull down the voltage.

The voltage on the capacitance load depends on the pull-up current or the pull-down current. The pull-up current and the pull-down current are controlled by both NBIAS and PBIAS. NBIAS and PBIAS are generated based on the control voltage. Thus, the delay due to charging or discharging the capacitance load depends on the control voltage. The process proceeds to S1099 and terminates.

It is noted that the order of steps in process 1000 can be suitably adjusted. In an example, S1010 and S1020 are performed at the same time.

Figure 11A:
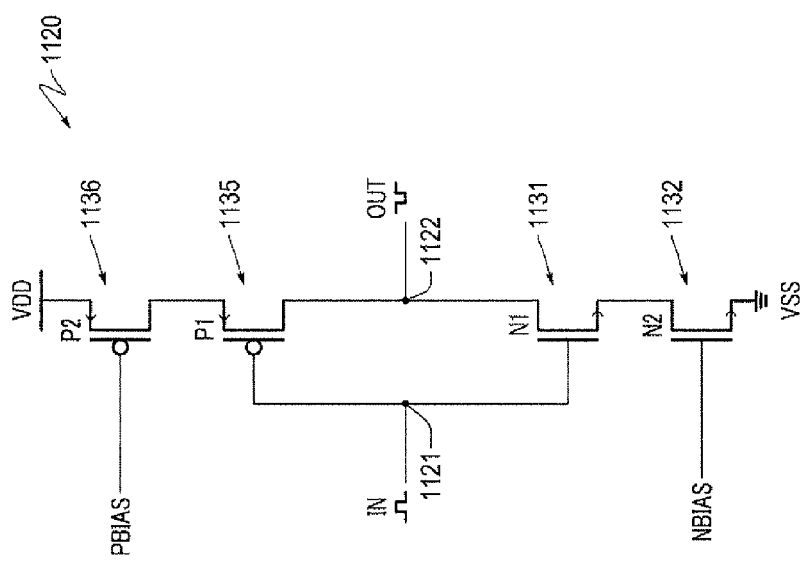
FIG. 11A shows a schematic diagram of another delay element for comparison.

FIG. 11A shows a schematic diagram of another delay element 1120 for comparison. The delay element 1120 includes a pull-up transistor 1135, a pull-down transistor 1131, a pull-up current switch transistor 1136 and a pull-down current switch transistor 1132. The pull-up current switch transistor 1136 is controlled by PBIAS, and the pull-down current switch transistor 1132 is controlled by NBIAS. The delay element 1120 includes an input node 1121 to receive an input signal IN, and an output node 1122 to output an output signal OUT with a delay relative to the input signal IN.

Figure 11B:
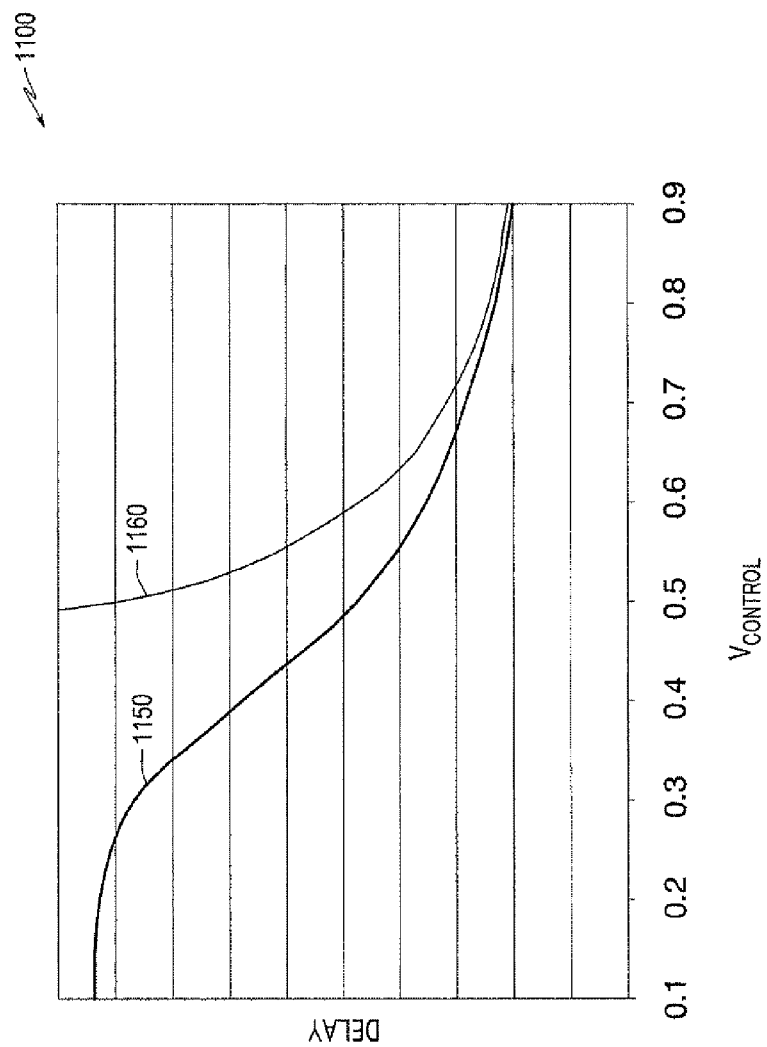
FIG. 11B shows a comparison plot of delay characteristics for two delay elements.

FIG. 11B shows a comparison plot 1100 of delay characteristics for the delay element 320 and the delay element 1120. The comparison plot 1100 includes a first curve 1150 and a second curve 1160. The first curve 1150 shows a delay characteristic of the delay element 320. The second curve 1160 shows a delay characteristic of the delay element 1120. The first curve 1150 has a better linearity when the control voltage range falls in a range [0.2V, 0.8V], for example.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. An integrated circuit (IC), comprising:
a delay element configured to drive an output node to generate an output signal in response to an input signal received at an input node, the delay element comprising:
a first switch transistor configured to switch on in response to the input signal satisfying a condition, and drive the output node with a first current that is controlled by a first bias voltage, a change in the first current being larger than a change in a second current; and
a second switch transistor configured to switch on in response to the input signal satisfying the condition, and drive the output node with the second current that is controlled by a second bias voltage, the first bias voltage and the second bias voltage being a complementary pair, both the first bias voltage and the second bias voltage being supplied from a same side of the first and second switch transistors.

2. The IC of claim 1, wherein both the first switch transistor and the second switch transistor are NMOS transistors or PMOS transistors.

3. The IC of claim 1, wherein the first switch transistor has a larger width/length ratio than the second switch transistor.

4. The IC of claim 1, wherein the delay element further comprises:
a first current switch transistor configured to provide the first current based on the first bias voltage; and
a second current switch transistor configured to provide the second current based on the second bias voltage.

5. The IC of claim 1, wherein the same side is a pull-up side of the first and second switch transistors.

6. The IC of claim 4, wherein the first current switch transistor has a larger width/length ratio than the second current switch transistor.

7. The IC of claim 1, wherein the delay element further comprises:
a first complementary switch transistor configured to switch on in a complementary manner to the first switch transistor to drive the output node; and
a second complementary switch transistor configured to switch on in a complementary manner to the second switch transistor to drive the output node.

8. The IC of claim 1, wherein the delay element further comprises:
- a third switch transistor configured to form a differential pair with the first switch transistor; and
- a fourth switch transistor configured to form a differential pair with the second switch transistor, the third switch transistor and the fourth switch transistor driving a differential output node to generate a differential output signal in response to a differential input signal received at a differential input node.

9. An integrated circuit (IC) comprising:
a delay locked loop that includes:
- a plurality of delay elements coupled in series to form a delay line to delay a delay line output signal based on a control voltage in response to a delay line input signal, each delay element being configured to drive a stage output node to generate a stage output signal in response to a stage input signal received at a stage input node;
- a phase detector configured detect a delay between the delay line output signal and the delay line input signal;
- a control voltage generator configured to generate the control voltage for the delay line based on the detected delay, wherein at least one of the delay elements comprises:
  - a first switch transistor configured to switch on in response to the stage input signal satisfying a condition, and drive the stage output node with a first current that is controlled by a first bias voltage, a change in the first current being larger than a change in a second current; and
  - a second switch transistor configured to switch on in response to the stage input signal satisfying the condition, and drive the stage output node with the second current that is controlled by a second bias voltage, the first bias voltage and the second bias voltage being a complementary pair, both the first bias voltage and the second bias voltage being supplied from a same side of the first and second switch transistors.

10. The IC of claim 9, wherein both the first switch transistor and the second switch transistor are NMOS transistors or PMOS transistors.

11. The IC of claim 9, wherein the first switch transistor has a larger width/length ratio than the second switch transistor.

12. The IC of claim 9, wherein the at least one of the delay elements further comprises:
- a first current switch transistor configured to provide the first current based on the first bias voltage that is equivalent to the control voltage; and
- a second current switch transistor configured to provide the second current based on the second bias voltage.

13. The IC of claim 12, wherein at least one of the first current switch transistor and the second current switch transistor is a size configurable current switch transistor.

14. The IC of claim 13, further comprising:
- a calibration controller configured to adjust the size configurable current switch transistor.

15. The IC of claim 9, wherein the at least one of the delay elements further comprises:
- a first complementary switch transistor configured to switch on in a complementary manner to the first switch transistor to drive the output node; and
- a second complementary switch transistor configured to switch in a complementary manner to the second switch transistor to drive the output node.

16. The IC of claim 9, wherein the at least one of the delay elements further comprises:
- a third switch transistor configured to form a differential pair with the first switch transistor; and
- a fourth switch transistor configured to form a differential pair with the second switch transistor, the third switch transistor and the fourth switch transistor driving a differential output node to generate a differential output signal in response to a differential input signal received at a differential input node.

17. A method of generating a delay, the method comprising:
- generating a first current for driving by a first switch transistor a voltage on a capacitance load in a direction based on a first bias voltage, a change in the first current being larger than a change in a second current;
- generating the second current for driving by a second switch transistor the voltage on the capacitance load in the direction based on a second bias voltage that has a value opposite to a value of the first bias voltage;
- supplying both the first bias voltage and the second bias voltage from a same side of the first and second switch transistors; and
- driving the capacitance load by the first current and the second current in response to an input signal.

18. The method of claim 17, further comprising:
- generating a first pull-down current for pulling down the voltage on the capacitance load based on the first bias voltage;
- generating a second pull-down current for pulling down the voltage on the capacitance load based on the second bias voltage; and
- pulling down the voltage on the capacitance load by a combination of the first pull-down current and the second pull-down current in response to the input signal.

19. The method of claim 17, further comprising:
- generating a first pull-up current for pulling up the voltage on the capacitance load based on the second bias voltage;
- generating a second pull-up current for pulling up the voltage on the capacitance load based on the first bias voltage; and
- pulling up the voltage on the capacitance load by a combination of the first pull-up current and the second pull-up current.

20. The method of claim 17, further comprising:
- controlling a first current switch transistor based on the first bias voltage to generate the first current; and
- controlling a second current switch transistor based on the second bias voltage to generate the second current, the first current switch transistor having a larger width/length ratio than the second current switch transistor.

* * * * *